(12) United States Patent
Punzalan et al.

(10) Patent No.: US 7,129,569 B2
(45) Date of Patent: Oct. 31, 2006

(54) LARGE DIE PACKAGE STRUCTURES AND FABRICATION METHOD THEREFOR

(75) Inventors: Jeffrey D. Punzalan, Singapore (SG); Jose Alvin Caparas, Singapore (SG); Jae Hun Ku, Singapore (SG)

(73) Assignee: St Assembly Test Services Ltd., Singapore (SG)

( * ) Notice: Subject to any disclaimer, the term of this patent is extended or adjusted under 35 U.S.C. 154(b) by 93 days.

(21) Appl. No.: 10/837,347

(22) Filed: Apr. 30, 2004

(65) Prior Publication Data

US 2005/0253230 A1    Nov. 17, 2005

(51) Int. Cl.
*H01L 23/495*    (2006.01)

(52) U.S. Cl. .................... 257/676; 257/666; 438/123

(58) Field of Classification Search ............... 257/676, 257/666, 678; 438/106, 123, 121
See application file for complete search history.

(56) References Cited

U.S. PATENT DOCUMENTS

| | | | | |
|---|---|---|---|---|
| 5,177,032 A | * | 1/1993 | Fogal et al. | 228/175 |
| 5,550,087 A | * | 8/1996 | Brossart | 29/832 |
| 5,886,405 A | * | 3/1999 | Kim et al. | 257/692 |

* cited by examiner

*Primary Examiner*—Roy Potter
(74) *Attorney, Agent, or Firm*—Mikio Ishimaru

(57) ABSTRACT

A method for fabricating large die package structures is provided wherein at least portions of the leadtips of at least a plurality of leadfingers of a leadframe are electrically insulated. A die is positioned on the electrically insulated leadtips. The die is electrically connected to at least a plurality of the leadfingers.

16 Claims, 7 Drawing Sheets

LARGE DIE PACKAGE STRUCTURES AND FABRICATION METHOD THEREFOR

TECHNICAL FIELD

The present invention relates generally to integrated circuits, and more particularly to package structures for integrated circuits.

BACKGROUND ART

An ongoing goal in the electronics industry is to continue reducing the size of electronic devices, such as camcorders and cellular telephones, while increasing performance and speed. To accomplish this, increased miniaturization of integrated circuit ("IC") packages for these devices is becoming increasingly essential. Personal data devices, notebook computers, portable music players, and digital cameras are but a few of the consumer products that require and benefit from this ongoing miniaturization of sophisticated electronics.

IC packages for complex electronic systems typically have a large number of interconnected IC chips, or dies. The IC dies are usually made from a semiconductor material such as silicon (Si) or gallium arsenide (GaAs). During manufacture, the several semiconductor devices on the IC dies are formed on the dies in various layers using photolithographic techniques. After manufacture, the IC dies are typically incorporated into packages that are then mounted on printed circuit boards.

IC die packages typically have numerous external pins, pads, or solder bumps that are mechanically attached, such as by soldering, to conductor patterns on the printed circuit boards. Typically, the packages in which these IC dies are mounted include a substrate or other die-mounting device. One example of such a substrate is a leadframe. High-performance leadframes typically include multi-layer structures having power, ground, and signal layers.

Leadframes also typically include an area on which an IC die is mounted and in which a number of power, ground, and/or signal leads is attached to the IC die. In particular, the power, ground, and/or signal leads of the leadframe are connected electrically to power, ground, and/or signal sites or pads on the IC die.

IC dies may be attached to the leadframe using adhesive or any other appropriate techniques for attaching such dies to a leadframe. Techniques commonly known to those skilled in the art for attaching such dies to a leadframe, for example, include soldering.

Once the IC dies are attached mechanically and electrically to the leadframe, the leadframe may be enclosed or encapsulated in a protective enclosure. Such enclosures may include encapsulation in a mold compound, such as plastic or epoxy, or in a multi-part housing made of plastic, ceramic, or metal. The enclosure may protect the leadframe and the attached die from physical, electrical, moisture, and/or chemical damage.

The leadframe and attached IC dies may then be mounted, for example, on a circuit board or circuit card along with other leadframes or devices. The circuit board or circuit card may then be incorporated into a wide variety of devices, such as computers, cellular telephones, automobiles, appliances, and so forth.

Typical known leadframes include a semiconductor die mounting structure, such as a die attach or mounting paddle. As technologies have improved and IC dies have become ever smaller, the leadframes for the chips, and the packages into which they are incorporated, have likewise become smaller and smaller. Modern semiconductor packaging is thus oriented toward small and thin semiconductor devices having high numbers of input and output pins.

Significantly, however, many of the older IC die designs and configurations are still popular and in use. Such IC dies continue to be manufactured, of course, in the larger configurations that were standard at the times of their designs. The packages in which such "mature" dies were originally incorporated can therefore be of substantial size by today's standards.

It would be beneficial to be able to use such mature IC dies in smaller contemporary package configurations, such as quad flat no lead ("QFN") packages. Such smaller, contemporary packages, however, usually have correspondingly smaller internal leadframes that cannot properly accommodate larger, older, mature IC dies. Instead, it has been necessary to use older, larger leadframes in older, larger packages. This causes size, design, and cost penalties that can lead to additional customization costs because modern smaller dimensions and interconnect configurations cannot be used.

Thus, a need still remains for efficient, economical, and effective solutions to enable older-style, larger-footprint IC dies to be incorporated efficiently and effectively into the smaller and more compact packages that are in use today. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method for fabricating large die package structures wherein at least portions of the leadtips of at least a plurality of leadfingers of a leadframe are electrically insulated. A die is positioned on the electrically insulated leadtips. The die is electrically connected to at least a plurality of the leadfingers.

This provides an efficient, economical, and effective solution that enables older-style, larger-footprint integrated circuit semiconductor dies to be incorporated efficiently and effectively into the smaller and more compact packages that are in use today.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
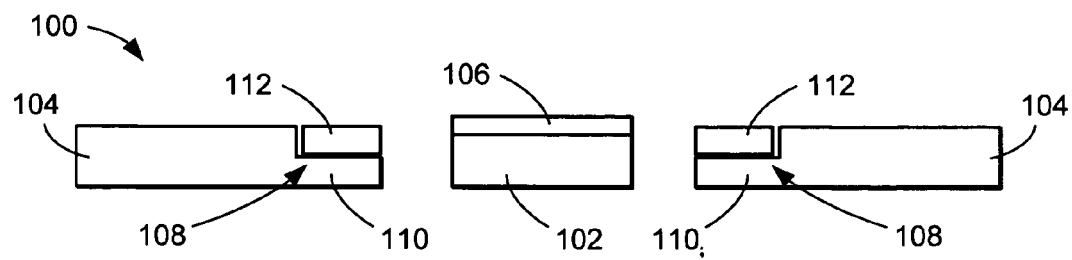
FIG. 1 is a view of a portion of a conventional, small leadframe adapted for packaging a mature, large die.

In the following description, numerous specific details are given to provide a thorough understanding of the invention. However, it will be apparent that the invention may be practiced without these specific details. In order to avoid obscuring the present invention, some well-known package configuration structural components are not disclosed in detail.

The drawings showing embodiments of the invention are semi-diagrammatic and not to scale and, particularly, some of the dimensions are for the clarity of presentation and are shown exaggerated in the FIGS. Additionally, where multiple embodiments are disclosed and described having some features in common, for clarity and ease of illustration, description, and comprehension thereof, like features one to another will ordinarily be described with like reference numerals.

The term "horizontal" as used herein is defined as a plane parallel to the conventional plane or surface of a die, die paddle (or "pad"), or die package, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

Figure 2:
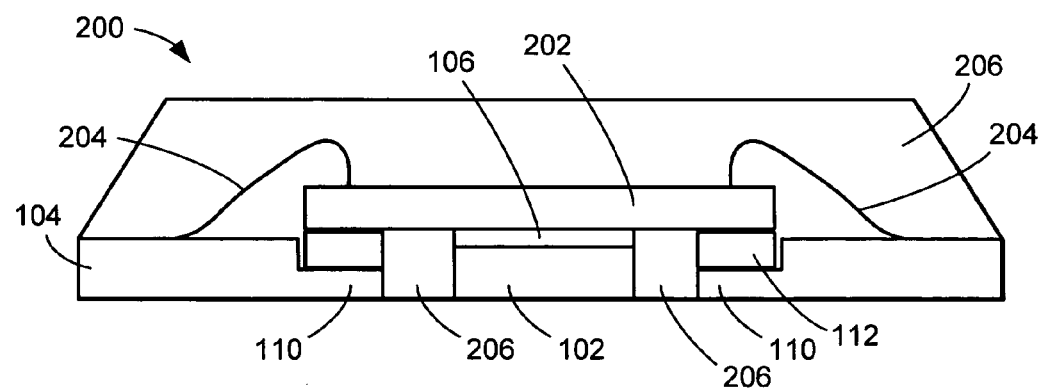
FIG. 2 is a figurative, cross-sectional view of a package formed from the leadframe structure of FIG. 1.

Referring now to FIG. 1, therein is shown a portion of a conventional, small leadframe 100 adapted for packaging an older ("mature"), large die (not shown, but see FIG. 2). The leadframe 100 is adapted from a standard leadframe used for fabricating an exposed-pad, single-row, quad flat no leads ("QFN") package. The leadframe 100 thus includes a die paddle 102 and leadfingers 104 distributed around the periphery of the die paddle 102. A die attach adhesive 106, which may be, for example, a conductive die attach epoxy adhesive, is located in conventional manner on top of the die paddle 102 for attaching a semiconductor die (not shown) thereto.

In the past, the leadfingers of leadframes have been sized to be spaced slightly outside the periphery of the dies for which the leadframe is designed. As die sizes have diminished, the spacings of the fingers have similarly diminished. Thus a contemporary leadframe no longer has sufficient room or space between the ends of the fingers to receive a mature, larger die.

It has been discovered, as shown in the leadframe 100, that contemporary leadframes can be adapted to accept mature, larger-footprint integrated circuit ("IC") semiconductor dies having dimensions that extend laterally considerably beyond the die paddle 102, and in fact extend over and bridge across the opposing leadfingers 104 on either side of the die paddle 102.

Thus, as taught herein, the inner ends of the leadfingers 104, facing the die paddle 102, have been provided with notches 108 in the upper surfaces thereof that have widths commensurate with the respective overhang of the mature die that is to be attached to the die paddle 102 therebetween. The notches 108, produced for example by etching, form notched inner leadtips 110 on the leadfingers 104. A non-conductive material 112, such as a suitable film selected for this purpose, is then positioned in the notches 108 to support the die thereon and to electrically insulate it from the leadfingers 104.

Referring now to FIG. 2, therein is shown a figurative, cross-sectional view of a package 200 formed from the leadframe 100 (FIG. 1). A mature, larger-footprint IC semiconductor die, such as a die 202, has been attached, as described above, to the die paddle 102 by the die attach adhesive 106. The die 202 is positioned on and electrically separated from the leadfingers 104 by the non-conductive material 112. Wire bonds 204 (e.g., of gold wire) then electrically connect the die 202 to respective leadfingers 104 in conventional fashion. Advantageously, the notched inner leadtips 110 of the leadfingers 104 provide support for the die 202 and keep it stable during the wire bonding of the wire bonds 204 thereto. The package 200 is then completed in conventional fashion by encapsulation of the leadframe and the other components in a mold compound 206.

The finished package thus accommodates the large die and affords the large die capability by using non-conductive materials, such as the non-conductive material 112, between the leadfingers 104 and the die 202 to insulate the bottom of the die 202 from electrical contact with the leadfingers 104.

Figure 3:
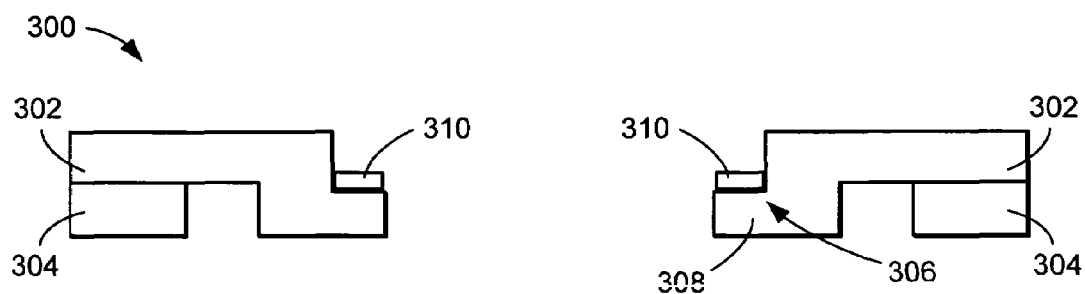
FIG. 3 is a view of a portion of a leadframe for forming a small, dual-row, exposed die backside quad flat no lead package incorporating a mature, large die.
Figure 4:
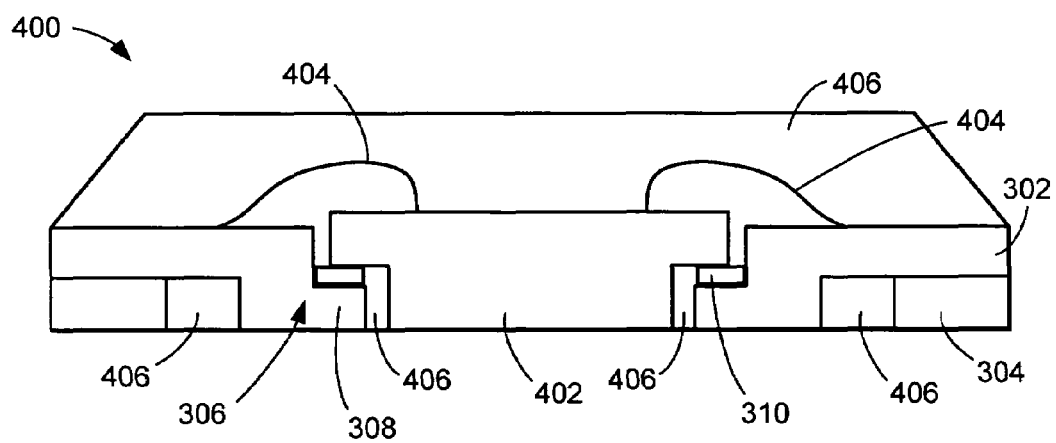
FIG. 4 is a figurative, cross-sectional view of a package formed from the leadframe structure of FIG. 3.

Referring now to FIG. 3, therein is shown a portion of a leadframe 300 for forming a small, dual-row, exposed die backside QFN package incorporating a mature, large die (not shown, but see FIG. 4). The duel-row configuration of the leadframe 300 thus includes leadfingers 302 that are interleaved with leadfingers 304. To accommodate larger-footprint, mature dies, the leadfingers 302 are provided with notches 306 on the inner leadtips 308 thereof. A non-conductive material 310, such as a non-conductive film, is located in the notches 306. It will be understood that the leadfingers 304 are provided with similar notches (not shown) and non-conductive material (not shown).

Referring now to FIG. 4, therein is shown a figurative, cross-sectional view of a package 400 formed from the leadframe 300 (FIG. 3). A die 402 has been located between the leadfingers 302 and 304, accommodated within the notches 306, and positioned on and supported on the non-conductive material 310. The die 402 is thus electrically insulated by the non-conductive material 310 from the inner leadtips 308.

The die 402 is a larger die that is nevertheless accommodated by the leadframe 300 by means of the notches 306 and the non-conductive material 310. In order to provide for an exposed die backside configuration, the die 402 has been configured with a double-cut process to narrow the die backside, as illustrated. The package 400 also includes wire bonds 404 and an enclosing mold compound 406 that encapsulates the leadframe and the other components.

An advantage of the configuration of the package 400 is that it can be used on a mold array process ("MAP") QFN package.

Figure 5:
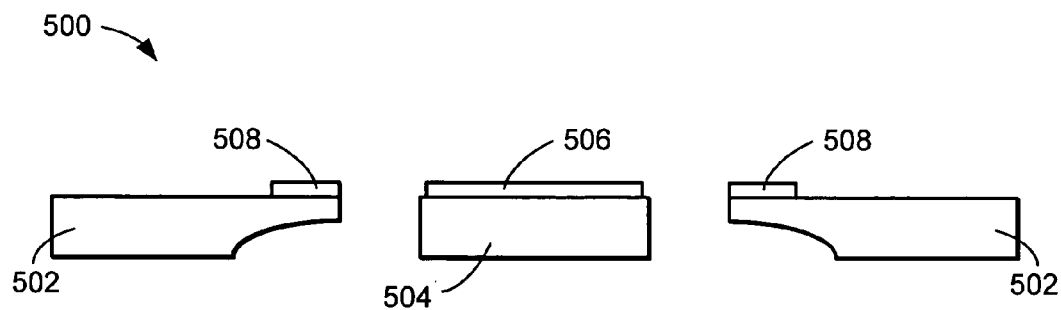
FIG. 5 is a view of a portion of a leadframe adapted for a larger-footprint, mature die.
Figure 6:
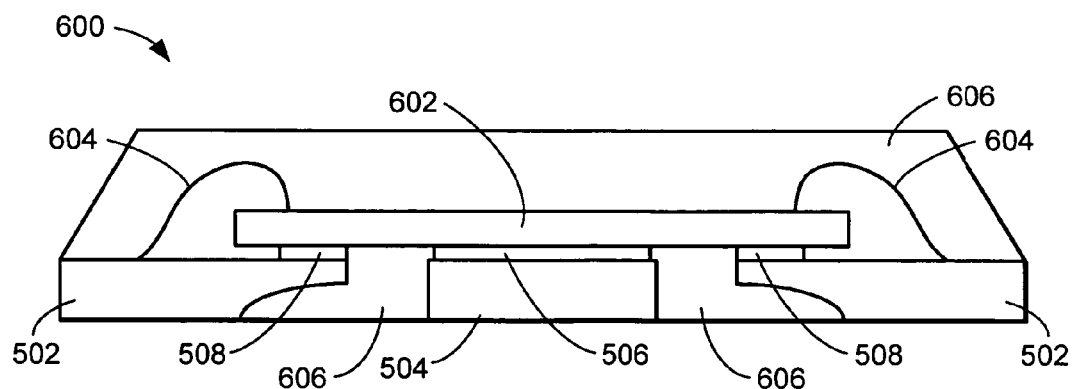
FIG. 6 is a figurative, cross-sectional view of a package formed from the leadframe structure of FIG. 5.

Referring now to FIG. 5, therein is shown a view of a portion of a leadframe 500 adapted for a larger-footprint, mature die (not shown, but see FIG. 6). The leadframe 500, which is adapted for forming a small, single-row, exposed-pad QFN package, has leadfingers 502 that are positioned parallel to or just below the surface of a die paddle 504 therebetween. A die attach adhesive 506 is then provided on the die paddle 504, and elevates the die (not shown) sufficiently above the tops of the leadfingers 502 to provide clearance or space for a non-conductive material 508 on the ends of the leadfingers 502. The leadfingers 502, therefore, do not require notches, but the die is still electrically insulated from the tips of the leadfingers 502 by the non-conductive material 508.

Referring now to FIG. 6, therein is shown a figurative, cross-sectional view of a package 600 formed from the leadframe 500 (FIG. 5). A die 602 is mounted and adhered upon the die paddle 504 by the die attach adhesive 506, positioned on the non-conductive material 508, and connected electrically to the leadfingers 502 by wire bonds 604. During the wire bonding of the wire bonds 604, the die 602 is supported and stabilized by the inner ends of the leadfingers 502. The package 600, which can be used with both pocket and MAP QFN, is then completed by encapsulation of the leadframe and the other components with a mold compound 606.

Figure 7:
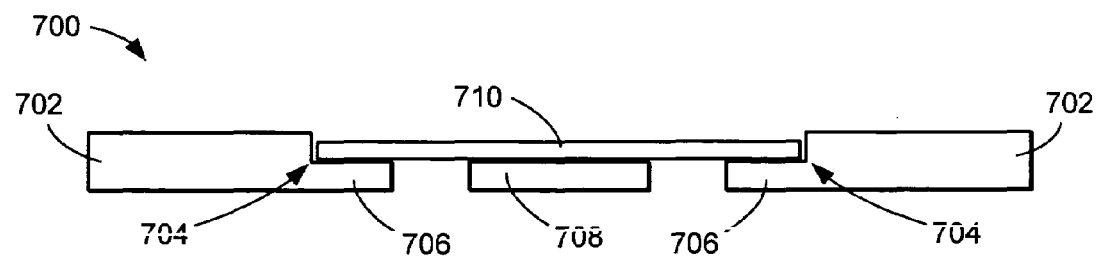
FIG. 7 is a view of a portion of a leadframe adapted for forming a single-row, exposed-pad quad flat no lead package incorporating a mature, large die.
Figure 8:
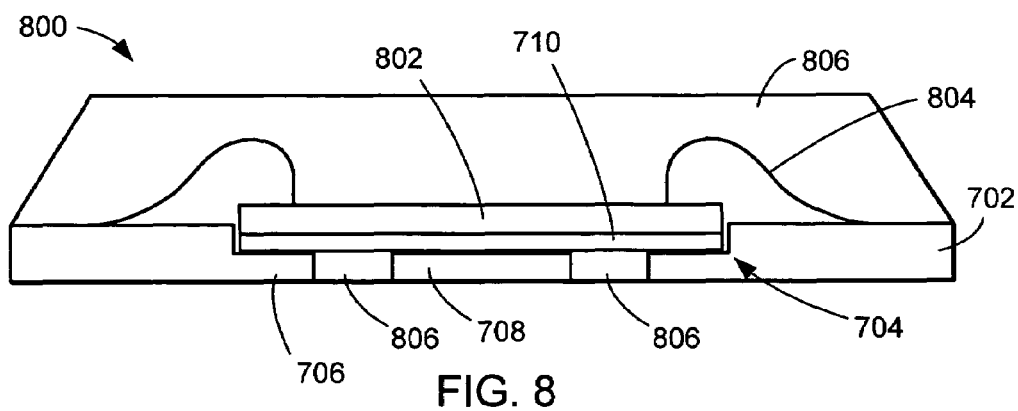
FIG. 8 is a figurative, cross-sectional view of a package formed from the leadframe structure of FIG. 7.

Referring now to FIG. 7, therein is shown a portion of a leadframe 700 adapted for forming a small, single-row, exposed-pad QFN package incorporating a mature, large die (not shown, but see FIG. 8). The leadframe 700 includes leadfingers 702, the inner ends of which have notches 704 formed, for example, by etching. The notched inner leadtips 706 formed thereby are configured to be at substantially the same height as the top of a die paddle 708 located therebetween. A single piece of non-conductive material 710, such as a film or epoxy, is positioned within and across the notches 704, extending entirely across the die paddle 708 therebetween.

Referring now to FIG. 8, therein is shown a figurative, cross-sectional view of a package 800 formed from the leadframe 700 (FIG. 7). A die 802 is positioned and mounted upon the non-conductive material 710 on the die paddle 708 and the notched inner leadtips 706, thereby electrically insulated from the notched inner leadtips 706, and connected electrically by wire bonds 804 to the leadfingers 702. During the wire bonding of the wire bonds 804, the die 802 is supported and stabilized by the inner ends of the leadfingers 702. The package 800, which can be used with both pocket and MAP QFN, is then completed by encapsulation of the leadframe and the other components with a mold compound 806.

Figure 9:
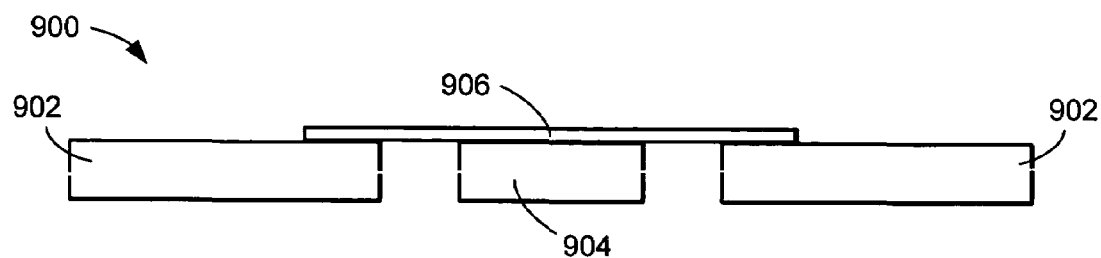
FIG. 9 is a view of a portion of a leadframe adapted for a larger-footprint, mature die.
Figure 10:
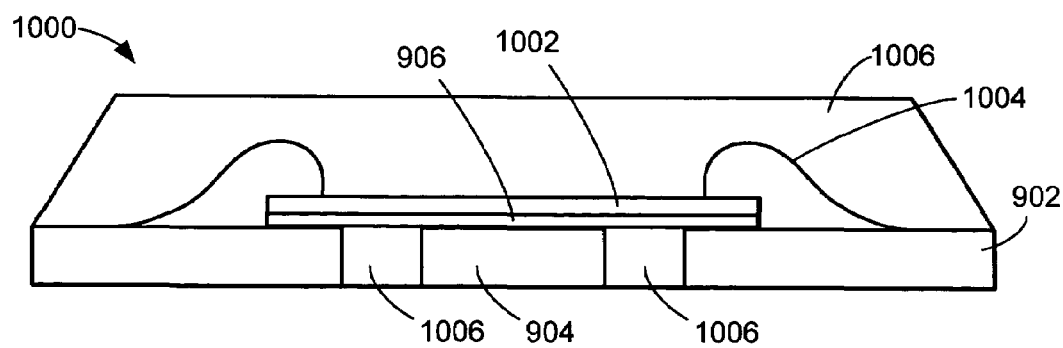
FIG. 10 is a figurative, cross-sectional view of a package formed from the leadframe structure of FIG. 9.

Referring now to FIG. 9, therein is shown a view of a portion of a leadframe 900 adapted for a larger-footprint, mature die (not shown, but see FIG. 10). The leadframe 900, which is adapted for forming a small, single-row, exposed-pad QFN package, has leadfingers 902 that are positioned parallel to or just below the surface of a die paddle 904 therebetween. A single piece of non-conductive material 906 is then provided on the die paddle 904 and extends thereacross onto the inner ends of the leadfingers 902. The non-conductive material 906 on the die paddle 904 elevates the die (not shown) sufficiently above the tops of the leadfingers 902 to provide clearance or space for the non-conductive material 906, so that the leadfingers 902 do not therefore require notches.

Referring now to FIG. 10, therein is shown a figurative, cross-sectional view of a package 1000 formed from the leadframe 900 (FIG. 9). A die 1002 is positioned and mounted upon the non-conductive material 906 on the die paddle 904 and the leadfingers 902, electrically insulated thereby from the leadfingers 902, and connected electrically to the leadfingers 902 by wire bonds 1004. During the wire bonding of the wire bonds 1004, the die 1002 is supported and stabilized by the inner ends of the leadfingers 902. The package 1000, which can be used with both pocket and MAP QFN, is then completed by encapsulation of the leadframe and the other components with a mold compound 1006.

Figure 11:
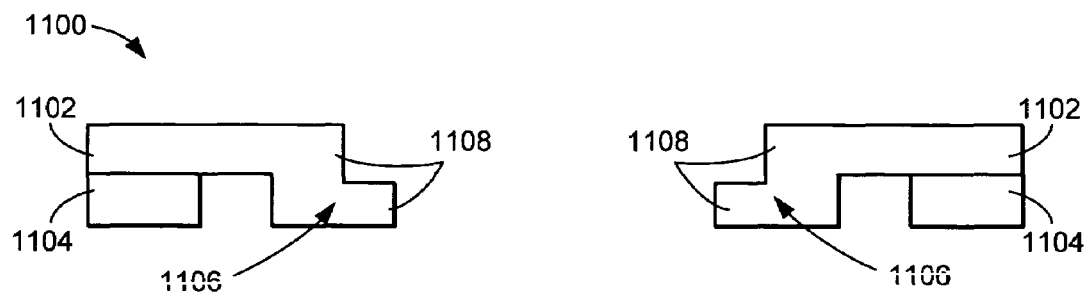
FIG. 11 is a view of a portion of a leadframe for forming a dual-row, non-exposed die pad quad flat no lead package for a flip chip die having a mature, large, wire-bonded die on top.

Referring now to FIG. 11, therein is shown a portion of a leadframe 1100 for forming a small, dual-row, non-exposed die pad QFN for a flip chip die (not shown, but see FIG. 12) having a mature, large, wire-bonded die (not shown, but see FIG. 12) on the top thereof. The leadframe 1100 thus includes leadfingers 1102 that are interleaved with leadfingers 1104. The leadfingers 1102 include notches 1106 on the tops of the inner ends thereof that form notched inner leadtips 1108. The notched inner leadtips 1108 are for receiving and connecting electrically to the solder bumps of a flip chip (not shown). The leadfingers 1104 are for receiving and electrically connecting to wire bonds (not shown) from a wire-bonded chip (not shown) to be located on top of the flip chip.

Figure 12:
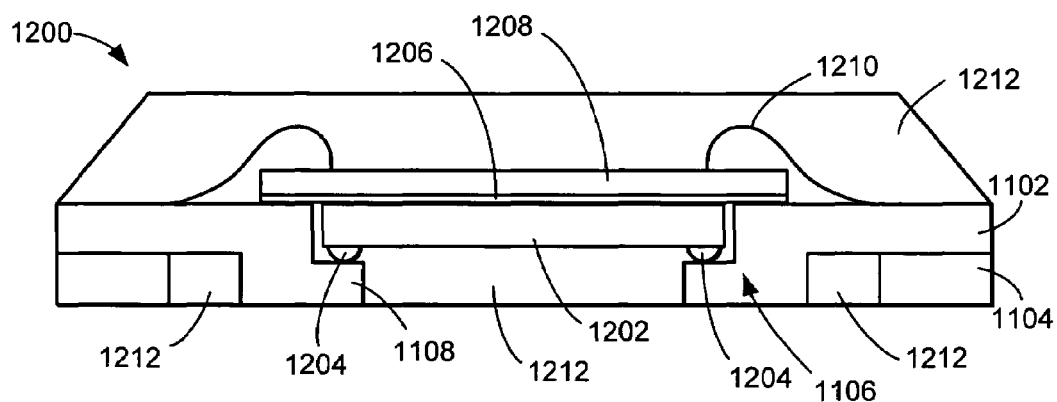
FIG. 12 is a figurative, cross-sectional view of a package formed from the leadframe structure of FIG. 11.

Referring now to FIG. 12, therein is shown a figurative, cross-sectional view of a package 1200 formed from the leadframe 1100 (FIG. 11). A flip chip 1202 is attached and electrically connected to the notched inner leadtips 1108 by its solder bumps 1204, within the notches 1106. A non-conductive material 1206 is located on the upper side of the flip chip 1202, opposite the solder bumps 1204, to support and electrically insulate a wire-bonded die 1208 thereupon. The wire-bonded die 1208 is a mature, larger-footprint IC semiconductor die having dimensions exceeding the spacing between opposing leadfingers 1102. However, the wire-bonded die 1208 is accommodated in the package 1200 by being positioned and supported on and above the flip chip 1202 and the fingers 1102. The wire-bonded die 1208 is also electrically insulated from the leadfingers 1102 and 1104 by the non-conductive material 1206, which has a transverse extent as great as that of the wire-bonded die 1208.

The wire-bonded die 1208 is then connected electrically to the leadfingers 1104 by wire bonds 1210. During the wire bonding of the wire bonds 1210, the wire-bonded die 1208 is supported and stabilized by the leadfingers 1102. The package 1200 is then completed by encapsulation of the leadframe and the other components with a mold compound 1212.

Figure 13:
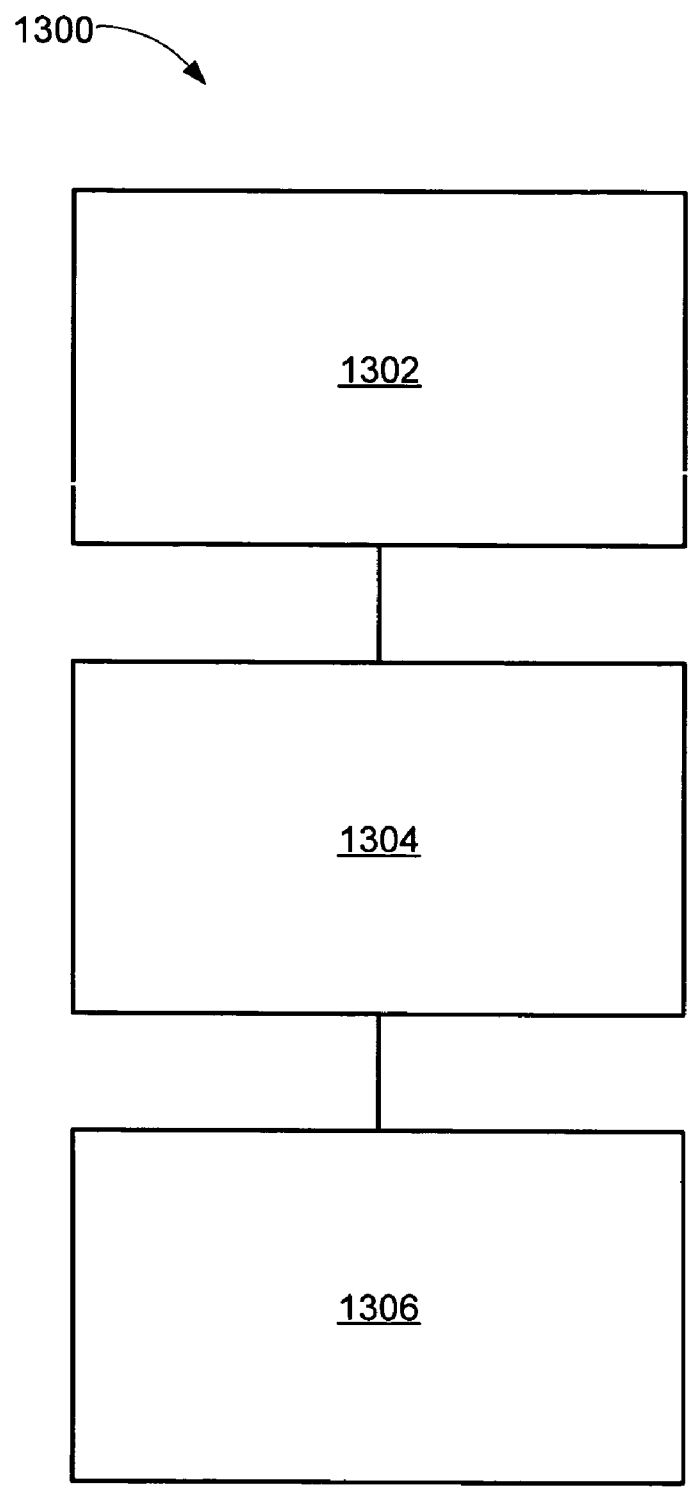
FIG. 13 is a flow chart of a method for fabricating large die package structures in accordance with the present invention.

Referring now to FIG. 13, therein is shown a flow chart of a method 1300 for fabricating large die package structures in accordance with the present invention. The method 1300 includes electrically insulating at least portions of the leadtips ot at least a plurality of leadfingers of a leadframe in a block 1302; positioning a die on the electrically insulated leadtips in a block 1304; and electrically connecting the die to at least a plurality of the leadfingers in a block 1306.

Thus, it has been discovered that the large die package structure and fabrication methods of the present invention furnish important and heretofore unknown and unavailable solutions, capabilities, and functional advantages for incorporating mature, larger-footprint IC semiconductor dies efficiently and effectively into the smaller and more compact packages that are in use today. Contemporary circuit board dimensions and interconnect configurations can therefore be used, saving the costs of customized interfaces and designs. The processes and configurations that are used are straightforward, economical, uncomplicated, highly versatile and effective, and can be implemented by adapting known technologies. The invention is thus fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A method for fabricating large die package structures, comprising:
   electrically insulating at least portions of the leadtips of at least a plurality of leadfingers of a leadframe;
   positioning a die on the electrically insulated leadtips;
   electrically connecting the die to at least a plurality of the leadfingers;
   encapsulating at least a portion of the leadframe and die in a mold compound; and
   wherein positioning the die further comprises attaching the die to a die paddle on the leadframe.

2. The method of claim 1 wherein electrically insulating further comprises insulating with a non-conductive material located between the leadtips and the die.

3. The method of claim 1 further comprising forming notches in the leadtips for receiving the die therein.

4. A method for fabricating large die package structures, comprising:
   electrically insulating at least portions of the leadtips of at least a plurality of leadfingers of a leadframe;
   positioning a die on the electrically insulated leadtips;
   electrically connecting the die to at least a plurality of the leadfingers;
   encapsulating at least a portion of the leadframe and die in a mold compound; and
   wherein positioning the die further comprises supporting the die on a flip chip that is located on the leadframe and electrically connected thereto.

5. A method for fabricating large die package structures, comprising:
   electrically insulating the leadtips of leadfingers of a leadframe;
   positioning a die on the electrically insulated leadtips;
   wire bonding the die to the leadfingers to electrically connect the die thereto;
   encapsulating at least a portion of the leadframe and die in a mold compound; and
   wherein positioning the die further comprises attaching the die to a die paddle on the leadframe with a conductive adhesive.

6. The method of claim 5 wherein electrically insulating further comprises insulating with a non-conductive film located between the leadtips and the die.

7. The method of claim 5 further comprising etching notches in the leadtips for receiving the die therein.

8. A method for fabricating large die package structures, comprising:
   electrically insulating the leadtips of leadfingers of a leadframe;
   positioning a die on the electrically insulated leadtips;
   wire bonding the die to the leadfingers to electrically connect the die thereto;
   encapsulating at least a portion of the leadframe and die in a mold compound; and
   wherein positioning the die further comprises supporting the die on a flip chip that is located on the leadframe and electrically connected thereto.

9. A large die package structure, comprising:
   a leadframe having leadfingers and a die paddle;
   leadtips on the leadfingers;
   at least portions of the leadtips of at least a plurality of the leadfingers being electrically insulated;
   a die positioned on the electrically insulated leadtips and attached to the die paddle on the leadframe;
   the die being electrically connected to at least a plurality of the leadfingers; and
   a mold compound encapsulating at least a portion of the leadframe and the die.

10. The structure of claim 9 wherein the leadfingers are electrically insulated with a non-conductive material located between the leadtips and the die.

11. The structure of claim 9 further comprising notches in the leadtips for receiving the die therein.

12. A large die package structure, comprising:
    a leadframe having leadfingers;
    leadtips on the leadfingers;
    at least portions of the leadtips of at least a plurality of the leadfingers being electrically insulated;
    a flip chip that is located on the leadframe and electrically connected thereto;
    a die positioned on the electrically insulated leadtips and supported on the flip chip;
    the die being electrically connected to at least a plurality of the leadfingers; and
    a mold compound encapsulating at least a portion of the leadframe and the die.

13. A large die package structure, comprising:
    a leadframe having leadfingers and a die paddle;
    leadtips on the leadfingers;
    the leadtips of the leadfingers being electrically insulated;
    a die positioned on the electrically insulated leadtips and attached to the die paddle on the leadframe;
    wirebonds electrically connecting the die to the leadfingers; and
    a mold compound encapsulating at least a portion of the leadframe and the die.

14. The structure of claim 13 wherein the leadfingers are electrically insulated with a non-conductive material located between the leadtips and the die.

15. The structure of claim 13 further comprising notches in the leadtips for receiving the die therein.

16. A large die package structure, comprising:
    a leadframe having leadfingers;
    leadtips on the leadfingers;
    the leadtips of the leadfingers being electrically insulated;
    a flip chip that is located on the leadframe and electrically connected thereto;
    a die positioned on the electrically insulated leadtips and supported on the flip chip;
    wirebonds electrically connecting the die to the leadfingers; and
    a mold compound encapsulating at least a portion of the leadframe and the die.

* * * * *